United States Patent
Ma et al.

(10) Patent No.: US 9,886,124 B2
(45) Date of Patent: Feb. 6, 2018

(54) OGS TOUCH SCREEN, MANUFACTURING METHOD THEREOF AND OGS TOUCH DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Tao Ma, Beijing (CN); Yinhu Huang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 57 days.

(21) Appl. No.: 14/906,347

(22) PCT Filed: Aug. 10, 2015

(86) PCT No.: PCT/CN2015/086474
§ 371 (c)(1),
(2) Date: Jan. 20, 2016

(87) PCT Pub. No.: WO2016/127608
PCT Pub. Date: Aug. 18, 2016

(65) Prior Publication Data
US 2016/0370923 A1  Dec. 22, 2016

(30) Foreign Application Priority Data
Feb. 9, 2015  (CN) .......................... 2015 1 0067653

(51) Int. Cl.
*G06F 3/041* (2006.01)
*C23C 14/08* (2006.01)
*C23C 14/58* (2006.01)

(52) U.S. Cl.
CPC ............ *G06F 3/0416* (2013.01); *G06F 3/041* (2013.01); *C23C 14/086* (2013.01); *C23C 14/5873* (2013.01); *G06F 2203/04103* (2013.01)

(58) Field of Classification Search
CPC ......... G06F 3/0416; G06F 2203/04103; G06F 3/041; C23C 14/5873
See application file for complete search history.

(56) References Cited

U.S. PATENT DOCUMENTS 4,525,448 A * 6/1985 Ghosh ................... G03F 7/0035
257/E21.027
2003/0035906 A1* 2/2003 Memarian ........... C23C 14/0036
428/1.3
(Continued)

FOREIGN PATENT DOCUMENTS

CN    103294307 A    9/2013
CN    103309539 A    9/2013
(Continued)

OTHER PUBLICATIONS

International Search Report dated Nov. 3, 2015 issued in corresponding International Application No. PCT/CN2015/086474 along with an English translation of the Written Opinion of the International Searching Authority.

*Primary Examiner* — Amr Awad
*Assistant Examiner* — Wing Chow
(74) *Attorney, Agent, or Firm* — Nath, Goldberg & Meyer; Joshua B. Goldberg; Annie J. Kock (57) ABSTRACT

The present invention discloses an OGS touch screen, a manufacturing method thereof and an OGS touch device. The OGS touch screen includes a substrate; a first p-ITO array that is provided in a display area of the substrate, the (Continued)

first p-ITO array including a plurality of first p-ITO touch electrodes; and a second p-ITO array that is provided on the first p-ITO array, the second p-ITO array including a plurality of second p-ITO touch electrodes, wherein an interval between any two adjacent first p-ITO touch electrodes in the first p-ITO array is smaller than an interval between any two adjacent second p-ITO touch electrodes in the second p-ITO array.

20 Claims, 2 Drawing Sheets

(56) References Cited

U.S. PATENT DOCUMENTS

| | | | | |
|---|---|---|---|---|
| 2011/0148780 | A1* | 6/2011 | Lu | G06F 3/044 345/173 |
| 2012/0255929 | A1* | 10/2012 | Yamaguchi | C09K 13/08 216/13 |
| 2014/0160377 | A1* | 6/2014 | Yamagishi | G06F 3/044 349/12 |
| 2014/0176481 | A1 | 6/2014 | Zhang et al. | |
| 2014/0327841 | A1 | 11/2014 | Shin et al. | |
| 2015/0338953 | A1* | 11/2015 | Liu | G06F 3/044 345/174 |

FOREIGN PATENT DOCUMENTS

| | | |
|---|---|---|
| CN | 103353815 A | 10/2013 |
| CN | 103455224 A | 12/2013 |
| CN | 103500043 A | 1/2014 |
| CN | 104777930 A | 7/2015 |

* cited by examiner

OGS TOUCH SCREEN, MANUFACTURING METHOD THEREOF AND OGS TOUCH DEVICE

This is a National Phase Application filed under 35 U.S.C. 371 as a national stage of PCT/CN2015/086474, filed Aug. 10, 2015, an application claiming the benefit of Chinese Application No. 201510067653.6, filed Feb. 9, 2015, the content of each of which is hereby incorporated by reference in its entirety.

FIELD OF THE INVENTION

The present invention relates to the technical filed of touch screen, and particularly, to an OGS touch screen, a manufacturing method thereof and an OGS touch device.

BACKGROUND OF THE INVENTION

As a product of intelligent human-machine interface, a touch screen has been widely used in production and life. OGS (One Glass Solution) touch screen is a protection screen of electronic product, which is manufactured by a technique of forming ITO (Indium Tin Oxide) touch electrodes and sensors directly on a glass substrate, wherein the glass substrate is used as a protection glass as well as touch sensors. However, since the thickness of the ITO touch electrode on the OGS touch screen is relatively large, the difference between a portion with ITO touch electrodes and the other portion without ITO touch electrodes on the OGS touch screen is large, which will result in emergence of pattern of ITO touch electrodes on the OGS touch screen, thereby affecting the appearance of the product.

In the prior art, the difference between a portion with ITO touch electrodes and the other portion without ITO touch electrodes on the OGS touch screen is eliminated by superposing an IM (Index Matching) layer with the ITO touch electrodes. Specifically, the emergence of pattern of ITO touch electrodes on the OGS touch screen is eliminated by forming an IM layer on a glass substrate; forming a black matrix on the glass substrate with the IM layer formed thereon; forming a metal layer on the glass substrate with the black matrix formed thereon; forming an OC (Over Cover) layer on the glass substrate with the metal layer formed thereon; and forming ITO touch electrodes on the glass substrate with the OC layer formed thereon and adjusting the IM layer by means of an optical simulation software so that the reflection index of the IM layer and the ITO layer which are superposed with each other is the same as that of the IM layer.

In the prior art, the emergence of the ITO touch electrodes on the OGS touch screen is eliminated by plating of an IM layer on a glass substrate, which makes the manufacturing cost of the OGS touch screen high.

SUMMARY OF THE INVENTION

To solve the problem of high cost in manufacturing the OGS touch screen, the present invention provides an OGS touch screen, a manufacturing method thereof and an OGS touch device.

According to a first aspect of the present invention, there is provided an OGS touch screen including a substrate; a first polycrystalline silicon-ITO (p-ITO) array that is provided in a display area of the substrate, the first p-ITO array including a plurality of first p-ITO touch electrodes arranged in a length direction of the substrate; and second p-ITO array that is provided on the first p-ITO array, the second p-ITO array including a plurality of second p-ITO touch electrodes arranged in the length direction of the substrate, wherein an interval between any two adjacent first p-ITO touch electrodes in the first p-ITO array is smaller than an interval between any two adjacent second p-ITO touch electrodes in the second p-ITO array.

Optionally, the first p-ITO array is a p-ITO array formed by etching using an etchant including aqua regia; and the second p-ITO array is a p-ITO array obtained by forming an amorphous silicon-ITO (a-ITO) array by etching using an etchant including oxalic acid and then converting the a-ITO array into the p-ITO array by performing an annealing process on the a-ITO array.

Optionally, the OGS touch screen further includes a black matrix that is provided at the peripheral area of the substrate; a metal layer that is provided on the substrate with the black matrix formed thereon; and an over cover layer that is formed on the substrate with the metal layer formed thereon, wherein the first p-ITO array is provided on the over cover layer.

Optionally, the first p-ITO array includes a plurality of first p-ITO touch electrodes that are equally spaced in the length direction of the substrate; and the second p-ITO array includes a plurality of second p-ITO touch electrodes that are equally spaced in the length direction of the substrate Optionally, the shape of the first p-ITO touch electrode is the same as the shape of the second p-ITO touch electrode and the center of a projection of the second p-ITO touch electrode on the first p-ITO touch electrode coincides with the center of the first p-ITO touch electrode.

According to a second aspect of the present invention, there is provided a manufacturing method of an OGS touch screen, which includes steps of forming a first p-ITO array in a display area of a substrate, and forming a second p-ITO array on the substrate with the first p-ITO array formed thereon, wherein the first p-ITO array includes a plurality of first p-ITO touch electrodes arranged in a length direction of the substrate and the second p-ITO array includes a plurality of second p-ITO touch electrodes arranged in the length direction of the substrate, an interval between any two adjacent first p-ITO touch electrodes in the first p-ITO array being smaller than an interval between any two adjacent second p-ITO touch electrodes in the second p-ITO array.

Optionally, the first p-ITO array includes a plurality of first p-ITO touch electrodes that are equally spaced in the length direction of the substrate; and the second p-ITO array includes a plurality of second p-ITO touch electrodes that are equally spaced in the length direction of the substrate.

Optionally, before the step of forming a first p-ITO array in a display area of a substrate, the method further includes steps of forming a black matrix at a peripheral area of the substrate; forming a metal layer on the substrate with the black matrix formed thereon; and forming an over cover layer on the substrate with the metal layer formed thereon, wherein the step of forming a first p-ITO array in a display area of a substrate includes forming the first p-ITO array in the display area of the substrate with the over cover layer formed thereon.

Optionally, the step of forming the first p-ITO array in the display area of the substrate with the over cover layer formed thereon and the step of forming a second p-ITO array on the substrate with the first p-ITO array formed thereon include steps of forming a p-ITO layer on the substrate with the over cover layer formed thereon; forming an a-ITO layer on the substrate with the p-ITO layer formed thereon; performing a first patterning process on the a-ITO layer to form an a-ITO array, the a-ITO array including a plurality of a-ITO touch electrodes arranged in the length direction of the substrate; performing a second patterning process on the p-ITO layer to form the first p-ITO array; and performing a high temperature annealing process on the a-ITO array, so that the a-ITO array is converted into the second p-ITO array.

Optionally, the same mask is used for exposing the a-ITO layer in the first patterning process and exposing the p-ITO layer in the second patterning process.

Optionally, the step of performing a first patterning process on the a-ITO layer to form an a-ITO array includes exposing the a-ITO layer by using the mask with light of a first exposure intensity; and the step of performing a second patterning process on the p-ITO layer to form the first p-ITO array includes exposing the p-ITO layer by using the mask with light of a second exposure intensity, wherein the second exposure intensity being weaker than the first exposure intensity.

Optionally, the etchant adopted in the first patterning process includes oxalic acid, and the etchant adopted in the second patterning process includes aqua regia.

Optionally, the step of forming a p-ITO layer on the substrate with the over cover layer formed thereon includes plating the p-ITO layer on the substrate with the over cover layer formed thereon under a high temperature condition, and the step of forming an a-ITO layer on the substrate with the p-ITO layer formed thereon includes plating the a-ITO layer on the substrate with the p-ITO layer formed thereon in a lower temperature condition.

Optionally, the temperature range of the high temperature condition is from 200 degrees centigrade to 250 degrees centigrade and the temperature of the low temperature condition is from 20 degrees centigrade to 40 degrees centigrade.

According to a third aspect of the present invention, there is provided an OGS touch device, which includes the OGS touch screen according to the first aspect of the present invention.

The present invention provides an OGS touch screen, a manufacturing method thereof and an OGS touch device, in which the first p-ITO array is formed in the display area of the substrate and the second p-ITO array is formed on the first p-ITO array, the first p-ITO array including first p-ITO touch electrodes arranged in the length direction of the substrate and the second p-ITO array including second p-ITO touch electrodes arranged in the length direction of the substrate, wherein an interval between any two adjacent first p-ITO touch electrodes in the first p-ITO array is smaller than an interval between any two adjacent second p-ITO touch electrodes in the second p-ITO array, so that the thickness of a region transiting from a portion with p-ITO array to a portion without p-ITO array on the substrate is decreased in a step manner and the differences of color and reflection index at a joint area between the portion with p-ITO array and the other portion without p-ITO array on the substrate become smaller, thereby reducing the difference between the appearances of the portion with p-ITO array and the portion without p-ITO array on the substrate without plating the IM layer. Therefore, the manufacturing cost of the OGS touch screen is reduced in addition to the elimination of the emergence of the pattern of the ITO touch electrodes on the OGS touch screen.

It should be noted that the foregoing general description and the following detailed description are merely illustrative and exemplary, rather than limiting the present invention.

BRIEF DESCRIPTION OF THE DRAWINGS

In order to explain the technical solutions in the embodiments of the present invention more clearly, the accompanying drawings used for the description of the embodiments will be briefly introduced below, and it is obviously for one of ordinary skill in the art that these drawings are merely some embodiments of the present invention and other drawings can be obtained from these drawings without any creative work.

The exemplary embodiments of the present invention have been illustrated by the above drawings, and these embodiments will be described in more details below. These drawings and text description are not for purpose of limiting the concept of the present invention in any manner, but to explain the concepts of the present invention for the one of ordinary skill in the art by referring the specific embodiments.

DETAILED DESCRIPTION OF THE EMBODIMENTS

In order to make the object, technical solutions and advantages of the present invention more clearly, the implementations of the present invention will be described in more details below in conjunction with the accompany drawings.

Figure 1:
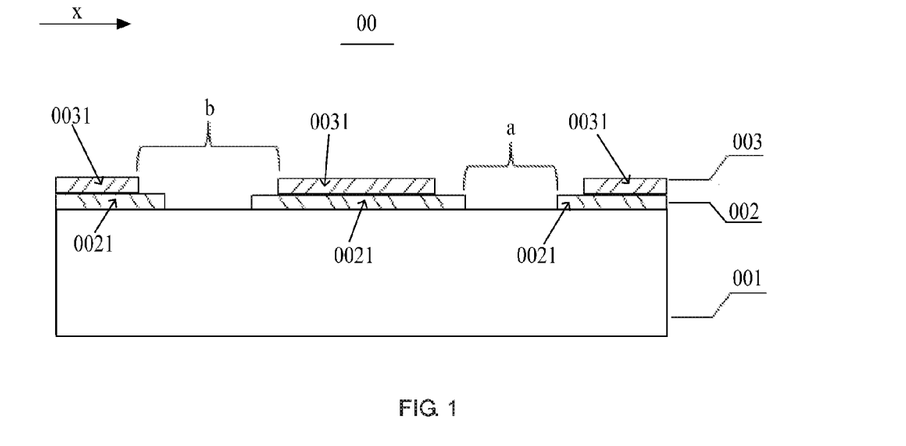
FIG. 1 is a structural schematic diagram of an OGS touch screen provided by a first embodiment of the present invention.

FIG. 1 is a structural schematic diagram of a cross section of an OGS touch screen 00 provided by a first embodiment of the present invention. As shown in FIG. 1, the OGS touch screen 00 provided by the first embodiment of the present invention may include a substrate 001.

A first p-ITO (polycrystalline silicon-ITO) array 002 may be formed in a display area of the substrate 001, and the first p-ITO array 002 may include a plurality of first p-ITO touch electrodes 0021 arranged in a length direction x of the substrate 001.

A second p-ITO array 003 may be formed on the first p-ITO array 002, and the second p-ITO array 003 may include a plurality of second p-ITO touch electrodes 0031 arranged in the length direction x of the substrate 001, wherein an interval between any two adjacent first p-ITO touch electrodes 0021 in the first p-ITO array 002 is smaller than an interval between any two adjacent second p-ITO touch electrodes 0031 in the second p-ITO array 003, as shown in FIG. 1, a first distance a is smaller than a second distance b, for example.

In summary, according to the OGS touch screen provided by the first embodiment of the present invention, the first p-ITO array is formed in the display area of the substrate and the second p-ITO array is formed on the first p-ITO array, the first p-ITO array including a plurality of first p-ITO touch electrodes arranged in the length direction of the substrate and the second p-ITO array including a plurality of second p-ITO touch electrodes arranged in the length direction of the substrate, wherein an interval between any two adjacent first p-ITO touch electrodes in the first p-ITO array is smaller than an interval between any two adjacent second p-ITO touch electrodes in the second p-ITO array, so that a thickness (film thickness) of a region transiting from a portion with p-ITO array to a portion without p-ITO array on the substrate is decreased in a step manner and the differences of color and reflection index at a joint between the portion with p-ITO array and the portion without p-ITO array on the substrate become smaller, thereby the difference between the appearances of the portion with p-ITO array and the portion without p-ITO array on the substrate can be reduced without plating the IM layer. Therefore, the manufacturing cost of the OGS touch screen is reduced in addition to the elimination of the emergence of the pattern of the ITO touch electrodes on the OGS touch screen.

Furthermore, the plurality of touch electrodes 0021 as shown in FIG. 1 may be equally spaced in the length direction x of the substrate 001, and in this case, any two adjacent first p-ITO touch electrodes 0021 in the first p-ITO array 002 has the same distance therebetween. The plurality of touch electrodes 0031 as shown in FIG. 1 may be equally spaced in the length direction x of the substrate 001 and in this case, any two adjacent first p-ITO touch electrodes 0031 in the second p-ITO array 003 has the same distance therebetween.

For example, the p-ITO touch electrodes in the first p-ITO array 002 and the second p-ITO array 003 may include a plurality of insulated sensing electrodes (also referred to as Rx sensing electrode) in a vertical direction or a plurality of insulated transmitting electrodes (also referred to as Tx transmitting electrode) in a horizontal direction. It should be noted that the OGS touch screen in the first embodiment of the present invention is manufactured by Single ITO technique, in which the first p-ITO array 002 and the second p-ITO array 003 are superposed to form an integral ITO layer, which can be regarded as the single ITO in the Single ITO technique.

The second p-ITO array 003 in FIG. 1 may be obtained by forming an a-ITO (amorphous silicon-ITO) array (not shown in FIG. 1) by etching using an etchant including oxalic acid under a low temperature condition and then converting the formed a-ITO array into the second p-ITO array through an annealing process. Specifically, the temperature range of the lower temperature condition may be from 20 degrees centigrade to 40 degrees centigrade. The oxalic acid is also called oxalate. The forming an a-ITO array by etching using an etchant including oxalic acid under a low temperature condition may include performing a first patterning process in which applying photoresisit, exposing by a mask, developing by a developer, etching by an etchant including oxalic acid and stripping off the photoresist are successively performed. An a-ITO array including a plurality of a-ITO touch electrodes (not shown in FIG. 1) arranged in the length direction x of the substrate 001 can be obtained through the first patterning process, and the plurality of a-ITO touch electrodes may be equal spaced in the length direction x of the substrate 001, for example. In such a case, the interval between any two adjacent a-ITO touch electrodes in the a-ITO array is of the same distance, and the interval is of the second distance b, for example. After the a-ITO array is obtained through performing the first patterning process, a high temperature annealing process may be performed on the a-ITO array, so that the a-ITO array is converted into the second p-ITO array 003, the interval between any two adjacent p-ITO touch electrodes 0031 in the second p-ITO array 003 being of the second distance b.

The first p-ITO array 002 in FIG. 1 may be a p-ITO array formed by etching using an etchant including aqua regia under a high temperature condition. Specifically, the temperature range of the high temperature condition may be from 200 degrees centigrade to 250 degrees centigrade. The aqua regia is also referred to as "aqua fortis" or "nitrohydrochloric acid" and is a yellow-orange fuming liquid with strong corrosive. The aqua regia is a mixture of concentrated nitric acid and concentrated hydrochloric acid in a molar ratio of 1:3. For example, the forming the first p-ITO array 002 by etching using an etchant including aqua regia under a high temperature condition may include performing a second patterning process in which applying photoresisit, exposing by a mask, developing by a developer, etching by an etchant including aqua regia and stripping off the photoresist are successively performed. The first p-ITO array 002 including the plurality of p-ITO touch electrodes 0021 arranged in the length direction x of the substrate 001 can be obtained through the second patterning process, and the interval between any two adjacent p-ITO touch electrodes 0021 in the first p-ITO array 002 is smaller than the interval between any two p-ITO touch electrodes 0031 in the second p-ITO array 003.

It should be noted that the masks for exposure used in the first patterning process and the second patterning process may be the same, and the exposure intensity adopted in the exposure using the mask in the first patterning process may be stronger than the exposure intensity adopted in the exposure using the mask in the second patterning process. Specifically, by using the identical mask in the first patterning process and the second patterning process, the amount of the masks can be reduced, the waste of the masks can be avoided, and the manufacturing cost of the OGS touch screen can be reduced. The exposure intensity adopted in the exposure using the mask in the first patterning process is stronger than the exposure intensity adopted in the exposure using the same mask in the second patterning process, so that the interval between any two adjacent a-ITO touch electrodes in the a-ITO array is larger than the interval between any two adjacent p-ITO touch electrodes 0021 in the p-ITO array 002 after developing, exposing and photoresist stripping.

Figure 2:
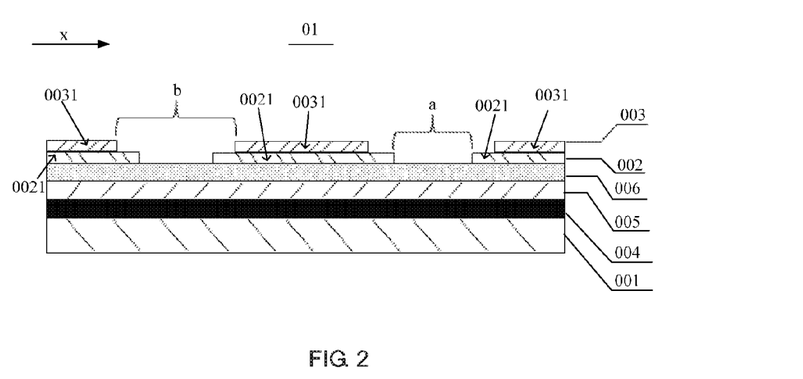
FIG. 2 is a structural schematic diagram of an OGS touch screen provided by a second embodiment of the present invention.

Furthermore, as shown in FIG. 2, a second embodiment of the present invention provides an OGS touch screen 01, and the OGS touch screen 01 may include a substrate 001; a black matrix 004 that is provided at a peripheral area of the substrate 001; a metal layer 005 that is provided on the substrate 001 with the black matrix 004 formed thereon; a over cover (OV) layer 006 that is provided on the substrate with the metal layer 005 formed thereon; and a first p-ITO array 002 that is arranged on the OC layer 006. Specifically, the black matrix 004 may be formed at the peripheral area of the black matrix 001, as shown in FIG. 2, which is a structural schematic diagram of a cross section of the peripheral area of the OGS touch screen 01. For example, the black matrix 004, the metal layer 005 and the OC layer 006 may be obtained by successively performing three patterning processes, each of which may include steps of applying photoresist, exposing by a mask, developing by a developer and etching by an etchant in above order. It should be noted that the black matrix 004, the metal layer 005 and the OC layer 006 may be obtained through other patterning processes, and the embodiment of the present invention will not apply limitations thereto. In particular, there is no black matrix in the sectional structure of the display area of the OGS touch screen, and the structures of other layers can refer to FIG. 2, the embodiment of the present invention will not described it redundantly herein.

The masks used for exposure in the first patterning process and the second patterning process may be the same in the embodiment of the present invention, and the positions of the mask in the first patterning process and the second patterning process may be unchanged, so that the shape of the p-ITO touch electrode 0021 (i.e., a first p-ITO touch electrode) in the first p-ITO array 002 is the same as the shape of the p-ITO touch electrode 0031 (i.e., a second p-ITO touch electrode) in the second p-ITO array 003, and the center of the projection of the second p-ITO touch electrode on the first p-ITO touch electrode coincides with the center of the first p-ITO touch electrode. In such a case, the plurality of first p-ITO touch electrodes and the plurality of second p-ITO touch electrodes can be distributed more uniformly on the OGS screen, and the appearance of the OGS screen can be more flat. The shape of the first p-ITO touch electrode or the second p-ITO touch electrode may be rhombus or irregular polygon, for example. In actual applications, the center of the projection of the second p-ITO touch electrode on the first p-ITO touch electrode may not coincide with the center of the first p-ITO touch electrode, and the embodiment of the present invention will not apply limitations thereto.

In the prior art, the emergence of pattern of ITO touch electrodes on an OGS touch screen is eliminated by forming an IM layer on the substrate. However, with the OGS touch screen provided by the embodiment of the present invention, forming the IM layer on the substrate is not necessary, and the thickness of the first p-ITO array and the second p-ITO array after superposition may be the same as that of the ITO touch electrode in the prior art, so that the thickness of the OGS touch screen can be reduced in addition to the elimination of the emergence of the pattern of the ITO touch electrodes on the OGS touch screen. For example, the second p-ITO touch electrodes are arranged on the first p-ITO touch electrodes, and the thickness of the first p-ITO touch electrode is the same as that of the second p-ITO touch electrode, which is equal to a half of the thickness of the ITO touch electrode in the prior art.

In summary, according to the OGS touch screen provided by the embodiment of the present invention, the first p-ITO array is formed in the display area of the substrate and the second p-ITO array is formed on the first p-ITO array, the first p-ITO array including p-ITO touch electrodes arranged in the length direction of the substrate and the second p-ITO array including p-ITO touch electrodes arranged in the length direction of the substrate, wherein an interval between any two adjacent p-ITO touch electrodes in the first p-ITO array is smaller than an interval between any two adjacent p-ITO touch electrodes in the second p-ITO array, so that the thickness of a region transiting from a portion with p-ITO array to the other portion without p-ITO array on the substrate is decreased in a step manner and the differences of color and reflection index at a joint area between the portion with p-ITO array and the other portion without p-ITO array on the substrate become smaller, thereby reducing the difference between the appearances of the portion with p-ITO array and the other portion without p-ITO array on the substrate without plating the IM layer. Therefore, the manufacturing cost of the OGS touch screen is reduced in addition to the elimination of the emergence of the pattern of the ITO touch electrodes on the OGS touch screen.

Figure 3:
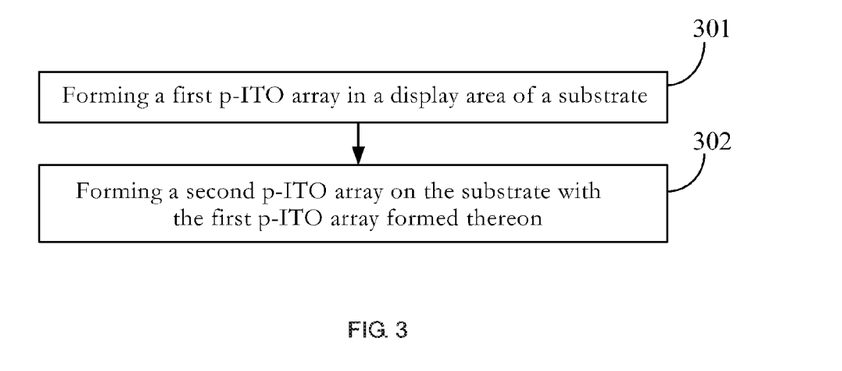
FIG. 3 is a flowchart of a manufacturing method of an OGS touch screen provided by a third embodiment of the present invention.

A third embodiment of the present invention further provides a manufacturing method of an OGS touch screen, which is suitable for manufacturing a visible area of the OGS touch screen, wherein the visible area may include a peripheral area and a display area. The manufacturing method of the OGS touch screen may include step 301 and step 302, as shown in FIG. 3.

At step 301, a first p-ITO array is formed in a display area of a substrate.

For example, the first p-ITO array may include a plurality of first p-ITO touch electrodes arranged in a length direction of the substrate. For example, the plurality of the first p-ITO touch electrodes in the first p-ITO array may be equally spaced in the length direction of the substrate. For example, the interval between any two adjacent p-ITO touch electrodes in the first p-ITO array is of a first distance, and the embodiment of the present invention will not apply limitations thereto, however.

At step 302, a second p-ITO array is formed on the substrate with the first p-ITO array formed thereon.

For example, the second p-ITO array may include a plurality of second p-ITO touch electrodes arranged in the length direction of the substrate and an interval between any two adjacent second p-ITO touch electrodes in the second p-ITO array is larger than the interval between any two adjacent first p-ITO touch electrodes in the first p-ITO array. For example, the plurality of the second p-ITO touch electrodes in the second p-ITO array may be equally spaced in the length direction of the substrate. For example, the interval between any two adjacent second p-ITO touch electrodes in the second p-ITO array is of a second distance that is larger than the first distance and the embodiment of the present invention will not apply limitations thereto, however.

In summary, according to the manufacturing method of the OGS touch screen provided by the third embodiment of the present invention, the first p-ITO array is formed in the display area on the substrate, the second p-ITO array is formed on the first p-ITO array, the first p-ITO array including p-ITO touch electrodes arranged in the length direction of the substrate and the second p-ITO array including p-ITO touch electrodes arranged in the length direction of the substrate, wherein an interval between any two adjacent p-ITO touch electrodes in the first p-ITO array is smaller than an interval between any two adjacent p-ITO touch electrodes in the second p-ITO array, so that the thickness of a region transiting from a portion with p-ITO array to the other portion without p-ITO array on the substrate is decreased in a step manner and the differences of color and reflection index at a joint area between the portion with p-ITO array and the portion without p-ITO array on the substrate become smaller, thereby reducing the difference between the appearances of the portion with p-ITO array and the other portion without p-ITO array on the substrate without plating the IM layer. Therefore, the manufacturing cost of the OGS touch screen is reduced in addition to the elimination of the emergence of the pattern of the ITO touch electrodes on the OGS touch screen.

Furthermore, before the step 301, the manufacturing method of the OGS touch screen may further include the steps of forming a black matrix at a peripheral area of the substrate, forming a metal layer on the substrate with the black matrix formed thereon, and forming an OC layer on the substrate with the metal layer formed thereon.

The step 301 may include forming the first p-ITO array in the display area of the substrate with the OC layer formed thereon. In such a case, the step 301 and step 302 may specifically include the following steps of: forming a p-ITO layer on the substrate with the OC layer formed thereon; forming an a-ITO layer on the substrate with the p-ITO layer formed thereon; performing a first patterning process on the a-ITO layer to form an a-ITO array, the a-ITO array including a plurality of a-ITO touch electrodes arranged in the length direction of the substrate; performing a second patterning process on the formed p-ITO layer to form the first p-ITO array; performing a high temperature annealing process on the a-ITO array, so that the a-ITO array is converted into the second p-ITO array.

Optionally, the same mask is used to expose the a-ITO layer and p-ITO layer in the first patterning process and the second patterning process. The performing the first patterning process on the a-ITO layer to form the a-ITO array may include exposing the a-ITO layer by using the mask with light of a first exposure intensity. The performing the second patterning process on the formed p-ITO layer to form the first p-ITO array may include exposing the p-ITO layer by using the mask with light of a second exposure intensity larger than the first exposure intensity.

For example, when forming the a-ITO array, the adopted etchant includes oxalic acid, and when forming the first p-ITO array, the adopted etchant includes aqua regia.

The forming the p-ITO layer on the substrate with the OC layer formed thereon may include plating the p-ITO layer on the substrate with the OC layer formed thereon under a high temperature condition. The forming the a-ITO layer on the substrate with the p-ITO layer formed thereon may include plating the a-ITO layer on the substrate with the p-ITO layer formed thereon under a low temperature condition. Specifically, the temperature range of the high temperature condition is from 200 degrees centigrade to 250 degrees centigrade, and the temperature range of the low temperature condition is from 20 degrees centigrade to 40 degrees centigrade.

In summary, according to the manufacturing method of the OGS touch screen provided by the embodiment of the present invention, the first p-ITO array is formed in the display area of the substrate and the second p-ITO array is formed on the first p-ITO array, the first p-ITO array including first p-ITO touch electrodes arranged in the length direction of the substrate and the second p-ITO array including second p-ITO touch electrodes arranged in the length direction of the substrate, wherein an interval between any two adjacent first p-ITO touch electrodes in the first p-ITO array is smaller than an interval between any two adjacent second p-ITO touch electrodes in the second p-ITO array, so that the thickness of a region transiting from a portion with p-ITO array to the other portion without p-ITO array on the substrate is decreased in a step manner and the differences of color and reflection index at a joint area between the portion with p-ITO array and the other portion without p-ITO array on the substrate become smaller, thereby reducing the difference between the appearances of the portion with p-ITO array and the other portion without p-ITO array on the substrate without plating the IM layer. Therefore, the manufacturing cost of the OGS touch screen is reduced in addition to the elimination of the emergence of the pattern of the ITO touch electrodes on the OGS touch screen.

A fourth embodiment of the present invention provides a manufacturing method of an OGS touch screen, which is suitable for manufacturing a visible area of the OGS touch screen, wherein the visible area includes a peripheral area and a display area. The manufacturing method of the OGS touch screen may include the following step 401 to step 408, as shown in FIG. 3.

Figure 4:
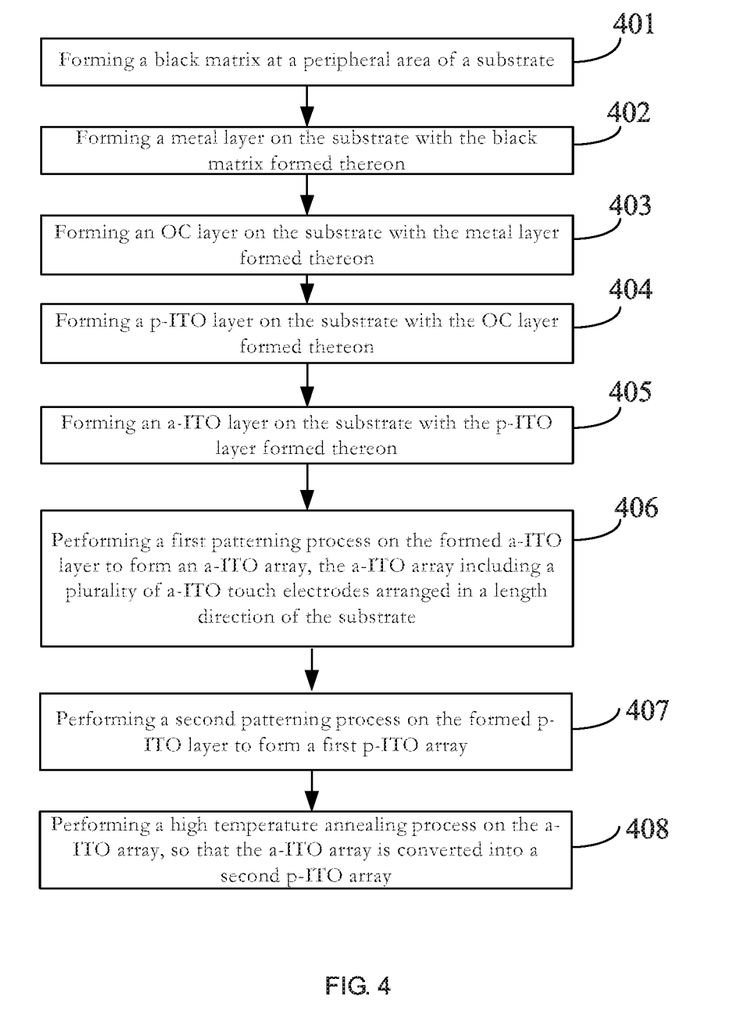
FIG. 4 is a flowchart of a manufacturing method of an OGS touch screen provided by a fourth embodiment of the present invention.

At step 401, a black matrix is formed at a peripheral area of the substrate.

For example, a black matrix layer may be applied at the peripheral area of the substrate, and then applying photoresist, exposing by a mask, developing by a developer, etching by an etchant and stripping off the photoresist are performed successively, so as to form a black matrix at the peripheral area of the substrate. It should be noted that the method of forming the black matrix at the peripheral area of the substrate in the embodiment of the present invention may refer to methods of forming a black matrix at a peripheral area of a substrate in the prior art, and the embodiment of the present invention will not described it redundantly herein.

At step 402, a metal layer is formed on the substrate with the black matrix formed thereon.

Specifically, the metal layer may be formed on the black matrix formed in the step 401 by means of deposition, application or sputtering. In practical applications, other methods may be used to form the metal layer on the black matrix formed in the step 401 and the embodiment of the present invention will not apply limitations thereto. The metal layer may include metal bridges and peripheral metal wirings, which will not be limited herein.

At step 403, an OC layer is formed on the substrate with the metal layer formed thereon.

The OC layer is formed on the metal layer formed in the step 402, which can protect the peripheral metal wirings and metal bridges in the metal layer. The method of forming an OC layer on the substrate with the metal layer formed thereon may refer to methods of forming a black matrix at a peripheral area of a substrate in the prior art, and the embodiment of the present invention will not described it redundantly herein.

At step 404, a p-ITO layer is formed on the substrate with the OC layer formed thereon.

For example, the p-ITO layer may be formed on the substrate with the OC layer formed thereon by means of deposition, application or sputtering under a high temperature condition. It should be noted that the temperature range of the high temperature condition may be from 200 degrees centigrade to 250 degrees centigrade, alternatively, the temperature range of the high temperature condition may be other temperature ranges, and the embodiment of the present invention will not apply limitations thereto.

At step 405, an a-ITO layer is formed on the substrate with the p-ITO layer formed thereon.

For example, the a-ITO layer may be formed on the substrate with the p-ITO layer formed thereon by means of deposition, application or sputtering under a low temperature condition. It should be noted that the temperature range of the low temperature condition may be from 20 degrees centigrade to 40 degrees centigrade alternatively, the temperature range of the low temperature condition may be other temperature ranges, and the embodiment of the present invention will not apply limitations thereto.

At step 406, a first patterning process is performed on the formed a-ITO layer to form an a-ITO array, which includes a plurality of a-ITO touch electrodes arranged in a length direction of the substrate.

For example, the first patterning process may be performed on the a-ITO layer formed in the step 405 to form the a-ITO array, in which the first patterning process may include successively performing steps of applying photoresist, exposing by a mask, developing by a developer, etching by an etchant, stripping off the photoresist and the like. It should be noted that, in the first patterning process, light of a first exposure intensity is adopted when exposing the a-ITO layer by using the mask; and when etching by using the etchant, the etchant may include oxalic acid, which can etch away the a-ITO layer without application of the photoresist but cannot etch away the p-ITO layer located under the a-ITO layer, so that the p-ITO layer located under the a-ITO layer can be avoided to be etched away in the first patterning process. For example, the a-ITO array obtained through the first patterning process may include a plurality of a-ITO touch electrodes arranged in the length direction of the substrate. For example, the plurality of a-ITO touch electrodes in the a-ITO array may be equally spaced in the length direction of the substrate. For example, the interval between any two adjacent a-ITO touch electrodes in the a-ITO array is of a second distance, and the embodiment of the present invention will not apply limitations thereto.

At step 407, a second patterning process is performed on the formed p-ITO layer to form a first p-ITO array.

For example, the second patterning process may be performed on the p-ITO layer formed in the step 404 to form a first p-ITO array, in which the first patterning process may include successively performing steps of applying photoresist, exposing by a mask, developing by a developer, etching by an etchant, stripping off the photoresist and the like. It should be noted that the mask used in the second patterning process is with the same as the mask used in the first patterning process, so that the amount of the masks can be reduced, the waste of the masks can be avoided, and the manufacturing cost of the OGS touch screen can be reduced.

In the second patterning process, light of a second exposure intensity is adopted when exposing the p-ITO layer by using the mask, and the second exposure intensity is smaller than the first exposure intensity, so that the interval between any two adjacent a-ITO touch electrodes in the a-ITO array formed after developing, exposing and photoresist stripping is larger than the interval between any two adjacent p-ITO touch electrodes in the first p-ITO array obtained from the second patterning process.

When etching by using the etchant in the second patterning process, the etchant may include aqua regia, which can etch away the a-ITO layer and the p-ITO layer. As part of the p-ITO layer and the a-ITO array formed in the step 406 are applied with photoresist thereon after applying photoresist, exposing by the mask and developing by the developer, when etching by using the etchant, the p-ITO layer without application of the photoresist will be etched away by the etchant including the aqua regia, and the a-ITO array will not be etched away by the etchant including the aqua regia due to the application of photoresist thereon. For example, the first p-ITO array obtained through the second patterning process may include a plurality of p-ITO touch electrodes arranged in the length direction of the substrate and the interval between any two adjacent p-ITO touch electrodes in the first p-ITO array is smaller than the interval between any two adjacent a-ITO touch electrodes in the a-ITO array. For example, the plurality of p-ITO touch electrodes in the first p-ITO array may be equally spaced in the length direction of the substrate, and the interval thereof may be of a first distance. The shape of the p-ITO electrode may be, for example, rhombus or irregular polygon, or the p-ITO electrode may be of other shapes, the embodiment of the present invention will not apply limitations thereto.

At step 408, a high temperature annealing process is performed on the a-ITO array, so that the a-ITO array is converted into a second p-ITO array.

For example, the a-ITO array formed in the step 406 may be converted into the second p-ITO array when subjected to the high temperature annealing process. In such a case, the second p-ITO array includes a plurality of second p-ITO touch electrodes arranged in the length direction of the substrate, and the plurality of the p-ITO touch electrodes in the second p-ITO array obtained in the step 408 are equally spaced in the length direction of the substrate in the case that the plurality of a-ITO touch electrodes in the a-ITO array formed in the step 406 are equally spaced in the length direction of the substrate. By performing the high temperature annealing process on the a-ITO array, the a-ITO array is converted into the second p-ITO array, it is possible to make the reflection index of the first p-ITO array be the same as that of the second p-ITO array. According to the embodiment of the present invention, the plurality of p-ITO touch electrodes in the first p-ITO array and the second p-ITO array may include a plurality of insulated sensing electrodes (also referred to as Rx sensing electrode) in a vertical direction or a plurality of insulated transmitting electrodes (also referred to as Tx transmitting electrode) in a horizontal direction. The metal bridges from the metal layer that is formed in the step 402 may be used for connecting the plurality of transmitting electrodes in the horizontal direction, and the plurality of transmitting electrodes in the horizontal direction may transmit signals therebetween through the metal bridges.

It should be noted that the masks used for exposure in the first patterning process at the step 406 and the second patterning process at the step 407 may be the same, and the positions of the mask in the first patterning process and the second patterning process may be unchanged, so that the shape of the p-ITO touch electrode (i.e., the second p-ITO touch electrode) in the second p-ITO array that is converted in step 408 from the a-ITO array formed in the step 406 is the same as the shape of the p-ITO touch electrode (i.e., the first p-ITO touch electrode) in the first p-ITO array that is formed in the step 407, and the center of the projection of the second p-ITO touch electrode on the first p-ITO touch electrode coincides with the center of the first p-ITO touch electrode. In such a case, the plurality of first p-ITO touch electrodes and the plurality of second p-ITO touch electrodes may be distributed more uniformly on the OGS screen, and the appearance of the OGS screen can be more flat. The shapes of the first p-ITO touch electrode and the second p-ITO touch electrode may be rhombus or irregular polygon, for example. In actual applications, the center of the projection of the second p-ITO touch electrode on the first p-ITO touch electrode may not coincide with the center of the first p-ITO touch electrode, and the embodiments of the present invention will not apply limitations thereto.

In the prior art, the emergence of pattern of ITO touch electrodes on an OGS touch screen is eliminated by forming an IM layer on the substrate. However, with the OGS touch screen provided by the embodiments of the present invention, forming the IM layer on the substrate is not necessary, and the thickness of the first p-ITO array and the second p-ITO array after superposition in the embodiments of the present invention may be the same as that of the ITO touch electrode in the prior art, so that the thickness of the OGS touch screen can be reduced in addition to the elimination of the emergence of the pattern of the ITO touch electrodes on the OGS touch screen. For example, the second p-ITO touch electrodes are arranged on the first p-ITO touch electrodes, and the thickness of the first p-ITO touch electrode is the same as that of the second p-ITO touch electrode, which is equal to a half of the thickness of the ITO touch electrode in the prior art.

In summary, according to the manufacturing method of the OGS touch screen provided by the fourth embodiment of the present invention, the first p-ITO array is formed in the display area of the substrate and the second p-ITO array is formed on the first p-ITO array, the first p-ITO array including a plurality of first p-ITO touch electrodes arranged in the length direction of the substrate and the second p-ITO array including a plurality of second p-ITO touch electrodes arranged in the length direction of the substrate, wherein the interval between any two adjacent p-ITO touch electrodes in the first p-ITO array is smaller than the interval between any two adjacent p-ITO touch electrodes in the second p-ITO array, so that the thickness of a region transiting from a portion with p-ITO array to a portion without p-ITO array on the substrate is decreased in a step manner and the differences of color and reflection index at a joint area between the portion with p-ITO array and the other portion without p-ITO array on the substrate become smaller, thereby reducing the difference between the appearances of the portion with p-ITO array and the portion without p-ITO array on the substrate without plating the IM layer. Therefore, the manufacturing cost of the OGS touch screen is reduced in addition to the elimination of the emergence of the pattern of the ITO touch electrodes on the OGS touch screen.

The embodiments of the present invention further provide an OGS touch device, which may include the OGS touch screen as shown in FIG. 1 or FIG. 2.

In conclusion, according to the OGS touch device provided by the embodiment of the present invention, the first p-ITO array is formed in the display area of the substrate and the second p-ITO array is formed on the first p-ITO array, the first p-ITO array including a plurality of first p-ITO touch electrodes arranged in the length direction of the substrate and the second p-ITO array including a plurality of second p-ITO touch electrodes arranged in the length direction of the substrate, wherein the interval between any two adjacent p-ITO touch electrodes in the first p-ITO array is smaller than the interval between any two adjacent p-ITO touch electrodes in the second p-ITO array, so that the thickness of a region transiting from a portion with p-ITO array to a portion without p-ITO array on the substrate is decreased in a step manner and the differences of color and reflection index at a joint area between the portion with p-ITO array and the portion without p-ITO array on the substrate become smaller, thereby reducing the difference between the appearances of the portion with p-ITO array and the other portion without p-ITO array on the substrate without plating the IM layer. Therefore, the manufacturing cost of the OGS touch screen is reduced in addition to the elimination of the emergence of the pattern of the ITO touch electrodes on the OGS touch screen.

The foregoing implementations are merely the preferred embodiments of the present invention, and not used for limiting the present invention. Any modification, equivalent substitution, improvement and the like made within the spirit and principle of the present invention should be fall within the protection scope of the present invention.

What is claimed is:

1. An ONE GLASS SOLUTION touch screen, including:
    a substrate;
    a first polycrystalline silicon-Indium Tin Oxide array that is provided in a display area of the substrate, the first polycrystalline silicon-Indium Tin Oxide array including a plurality of first polycrystalline silicon-Indium Tin Oxide touch electrodes arranged in a length direction of the substrate; and
    a second polycrystalline silicon-Indium Tin Oxide array that is entirely provided on and entirely touching the first polycrystalline silicon-Indium Tin Oxide array, the second polycrystalline silicon-Indium Tin Oxide array including a plurality of second polycrystalline silicon-Indium Tin Oxide touch electrodes arranged in the length direction of the substrate,
    wherein an interval between any two adjacent first polycrystalline silicon-Indium Tin Oxide touch electrodes in the first polycrystalline silicon-Indium Tin Oxide array is smaller than an interval between any two adjacent second polycrystalline silicon-Indium Tin Oxide touch electrodes in the second polycrystalline silicon-Indium Tin Oxide array.

2. The ONE GLASS SOLUTION touch screen according to claim 1, wherein
    the first polycrystalline silicon-Indium Tin Oxide array is a polycrystalline silicon-Indium Tin Oxide array formed by etching using an etchant including aqua regia; and the second polycrystalline silicon-Indium Tin Oxide array is a polycrystalline silicon-Indium Tin Oxide array obtained by forming an amorphous silicon-Indium Tin Oxide array by etching using an etchant including oxalic acid and then converting the amorphous silicon-Indium Tin Oxide array into the polycrystalline silicon-Indium Tin Oxide array by performing an annealing process on the amorphous silicon-Indium Tin Oxide array.

3. The ONE GLASS SOLUTION touch screen according to claim 2, wherein
    the shape of the first polycrystalline silicon-Indium Tin Oxide touch electrode is the same as the shape of the second polycrystalline silicon-Indium Tin Oxide touch electrode and the center of a projection of the second polycrystalline silicon-Indium Tin Oxide touch electrode on the first polycrystalline silicon-Indium Tin Oxide touch electrode coincides with the center of the first polycrystalline silicon-Indium Tin Oxide touch electrode.

4. A ONE GLASS SOLUTION touch device, which includes the ONE GLASS SOLUTION touch screen according to claim 2.

5. The ONE GLASS SOLUTION touch screen according to claim 1, further including:
    a black matrix that is provided at a peripheral area of the substrate;
    a metal layer that is provided on the substrate with the black matrix formed thereon; and
    an over cover layer that is formed on the substrate with the metal layer formed thereon,
    wherein the first polycrystalline silicon-Indium Tin Oxide array is provided on the over cover layer.

6. The ONE GLASS SOLUTION touch screen according to claim 5, wherein
    the shape of the first polycrystalline silicon-Indium Tin Oxide touch electrode is the same as the shape of the second polycrystalline silicon-Indium Tin Oxide touch electrode and the center of a projection of the second polycrystalline silicon-Indium Tin Oxide touch electrode on the first polycrystalline silicon-Indium Tin Oxide touch electrode coincides with the center of the first polycrystalline silicon-Indium Tin Oxide touch electrode.

7. A ONE GLASS SOLUTION touch device, which includes the ONE GLASS SOLUTION touch screen according to claim 5.

8. The ONE GLASS SOLUTION touch screen according to claim 1, wherein
    the first polycrystalline silicon-Indium Tin Oxide array includes a plurality of first polycrystalline silicon-Indium Tin Oxide touch electrodes that are equally spaced in the length direction of the substrate; and the second polycrystalline silicon-Indium Tin Oxide array includes a plurality of second polycrystalline silicon-Indium Tin Oxide touch electrodes that are equally spaced in the length direction of the substrate.

9. The ONE GLASS SOLUTION touch screen according to claim 8, wherein
the shape of the first polycrystalline silicon-Indium Tin Oxide touch electrode is the same as the shape of the second polycrystalline silicon-Indium Tin Oxide touch electrode and the center of a projection of the second polycrystalline silicon-Indium Tin Oxide touch electrode on the first polycrystalline silicon-Indium Tin Oxide touch electrode coincides with the center of the first polycrystalline silicon-Indium Tin Oxide touch electrode.

10. The ONE GLASS SOLUTION touch screen according to claim 1, wherein
the shape of the first polycrystalline silicon-Indium Tin Oxide touch electrode is the same as the shape of the second polycrystalline silicon-Indium Tin Oxide touch electrode and the center of a projection of the second polycrystalline silicon-Indium Tin Oxide touch electrode on the first polycrystalline silicon-Indium Tin Oxide touch electrode coincides with the center of the first polycrystalline silicon-Indium Tin Oxide touch electrode.

11. A ONE GLASS SOLUTION touch device, which includes the ONE GLASS SOLUTION touch screen according to claim 1.

12. A manufacturing method of an ONE GLASS SOLUTION touch screen, which includes steps of:
forming a first polycrystalline silicon-Indium Tin Oxide array in a display area of a substrate, and forming a second polycrystalline silicon-Indium Tin Oxide array entirely on and entirely touching the first polycrystalline silicon-Indium Tin Oxide array,
wherein the first polycrystalline silicon-Indium Tin Oxide array includes a plurality of first polycrystalline silicon-Indium Tin Oxide touch electrodes arranged in a length direction of the substrate and the second polycrystalline silicon-Indium Tin Oxide array includes a plurality of second polycrystalline silicon-Indium Tin Oxide touch electrodes arranged in the length direction of the substrate, an interval between any two adjacent first polycrystalline silicon-Indium Tin Oxide touch electrodes in the first polycrystalline silicon-Indium Tin Oxide array being smaller than an interval between any two adjacent second polycrystalline silicon-Indium Tin Oxide touch electrodes in the second polycrystalline silicon-Indium Tin Oxide array.

13. The method according to claim 12, wherein
the first polycrystalline silicon-Indium Tin Oxide array includes a plurality of first polycrystalline silicon-Indium Tin Oxide touch electrodes that are equally spaced in the length direction of the substrate; and
the second polycrystalline silicon-Indium Tin Oxide array includes a plurality of second polycrystalline silicon-Indium Tin Oxide touch electrodes that are equally spaced in the length direction of the substrate.

14. The method according to claim 12, wherein before the step of forming a first polycrystalline silicon-Indium Tin Oxide array in a display area of a substrate, the method further includes steps of:
forming a black matrix at a peripheral area of the substrate;
forming a metal layer on the substrate with the black matrix formed thereon; and
forming an over cover layer on the substrate with the metal layer formed thereon,
wherein the step of forming a first polycrystalline silicon-Indium Tin Oxide array in a display area of a substrate includes forming the first polycrystalline silicon-Indium Tin Oxide array in the display area of the substrate with the over cover layer formed thereon.

15. The method according to claim 14, wherein the step of forming the first polycrystalline silicon-Indium Tin Oxide array in the display area of the substrate with the over cover layer formed thereon and the step of forming a second polycrystalline silicon-Indium Tin Oxide array on the substrate with the first polycrystalline silicon-Indium Tin Oxide array formed thereon include steps of:
forming a polycrystalline silicon-Indium Tin Oxide layer on the substrate with the over cover layer formed thereon;
forming an amorphous silicon-Indium Tin Oxide layer on the substrate with the polycrystalline silicon-Indium Tin Oxide layer formed thereon;
performing a first patterning process on the amorphous silicon-Indium Tin Oxide layer to form an amorphous silicon-Indium Tin Oxide array, the amorphous silicon-Indium Tin Oxide array including a plurality of amorphous silicon-Indium Tin Oxide touch electrodes arranged in the length direction of the substrate;
performing a second patterning process on the polycrystalline silicon-Indium Tin Oxide layer to form the first polycrystalline silicon-Indium Tin Oxide array; and
performing a high temperature annealing process on the amorphous silicon-Indium Tin Oxide array, so that the amorphous silicon-Indium Tin Oxide array is converted into the second polycrystalline silicon-Indium Tin Oxide array.

16. The method according to claim 15, wherein
a same mask is used for exposing the amorphous silicon-Indium Tin Oxide layer in the first patterning process and exposing the polycrystalline silicon-Indium Tin Oxide layer in the second patterning process.

17. The method according to claim 16, wherein
the step of performing a first patterning process on the amorphous silicon-Indium Tin Oxide layer to form an amorphous silicon-Indium Tin Oxide array includes exposing the amorphous silicon-Indium Tin Oxide layer by using a mask with light of a first exposure intensity; and
the step of performing a second patterning process on the polycrystalline silicon-Indium Tin Oxide layer to form the first polycrystalline silicon-Indium Tin Oxide array includes exposing the polycrystalline silicon-Indium Tin Oxide layer by using the mask with light of a second exposure intensity, wherein the second exposure intensity is smaller than the first exposure intensity.

18. The method according to claim 15, wherein the etchant adopted in the first patterning process includes oxalic acid, and the etchant adopted in the second patterning process includes aqua regia.

19. The method according to claim 15, wherein the step of forming a polycrystalline silicon-Indium Tin Oxide layer on the substrate with the over cover layer formed thereon includes plating the polycrystalline silicon-Indium Tin Oxide layer on the substrate with the over cover layer formed thereon under a high temperature condition, and
the step of forming an amorphous silicon-Indium Tin Oxide layer on the substrate with the polycrystalline silicon-Indium Tin Oxide layer formed thereon includes plating the amorphous silicon-Indium Tin Oxide layer on the substrate with the polycrystalline silicon-Indium Tin Oxide layer formed thereon in a lower temperature condition.

20. The method according to claim 19, wherein the temperature range of the high temperature condition is from 200 degrees centigrade to 250 degrees centigrade and the temperature of the low temperature condition is from 20 degrees centigrade to 40 degrees centigrade.

* * * * *